United States Patent [19]

Hansen, Jr.

[11] 4,423,374

[45] Dec. 27, 1983

[54] UNBALANCED CURRENT DETECTOR FOR THREE PHASE ELECTRICAL SYSTEM

[75] Inventor: Charles M. Hansen, Jr., Tinton Falls, N.J.

[73] Assignee: The Bendix Corporation, Teterboro, N.J.

[21] Appl. No.: 303,738

[22] Filed: Sep. 21, 1981

[51] Int. Cl.³ ............................................. G01R 25/00
[52] U.S. Cl. ...................................... 324/86; 328/133; 324/140 R
[58] Field of Search ................. 324/77 D, 77 E, 77 F, 324/78 R, 133, 140 R, 86

[56] References Cited

U.S. PATENT DOCUMENTS 3,783,341  1/1974  Beckwith ............................ 328/133
4,199,798  4/1980  Leppke et al. ......................... 324/86

Primary Examiner—Michael J. Tokar
Assistant Examiner—B. J. Kelley
Attorney, Agent, or Firm—Anthony F. Cuoco; Vett Parsigian

[57] ABSTRACT

An unbalanced current detector for a three phase electrical system of the type including a current transformer (4, 6, 8) for each phase ($\phi A$, $\phi B$, $\phi C$) and a burden resistor (16) which receives a rectified output of the current transformer is disclosed. The harmonic content of a rectified ripple voltage developed across the burden resistor (16) is applied to a filter (20) for extracting desired frequencies and rejecting other frequencies, and the filter output is applied to a level detecting and amplifying circuit (54) the output of which is applied to an indicator (77) to indicate an unbalanced current condition.

9 Claims, 1 Drawing Figure

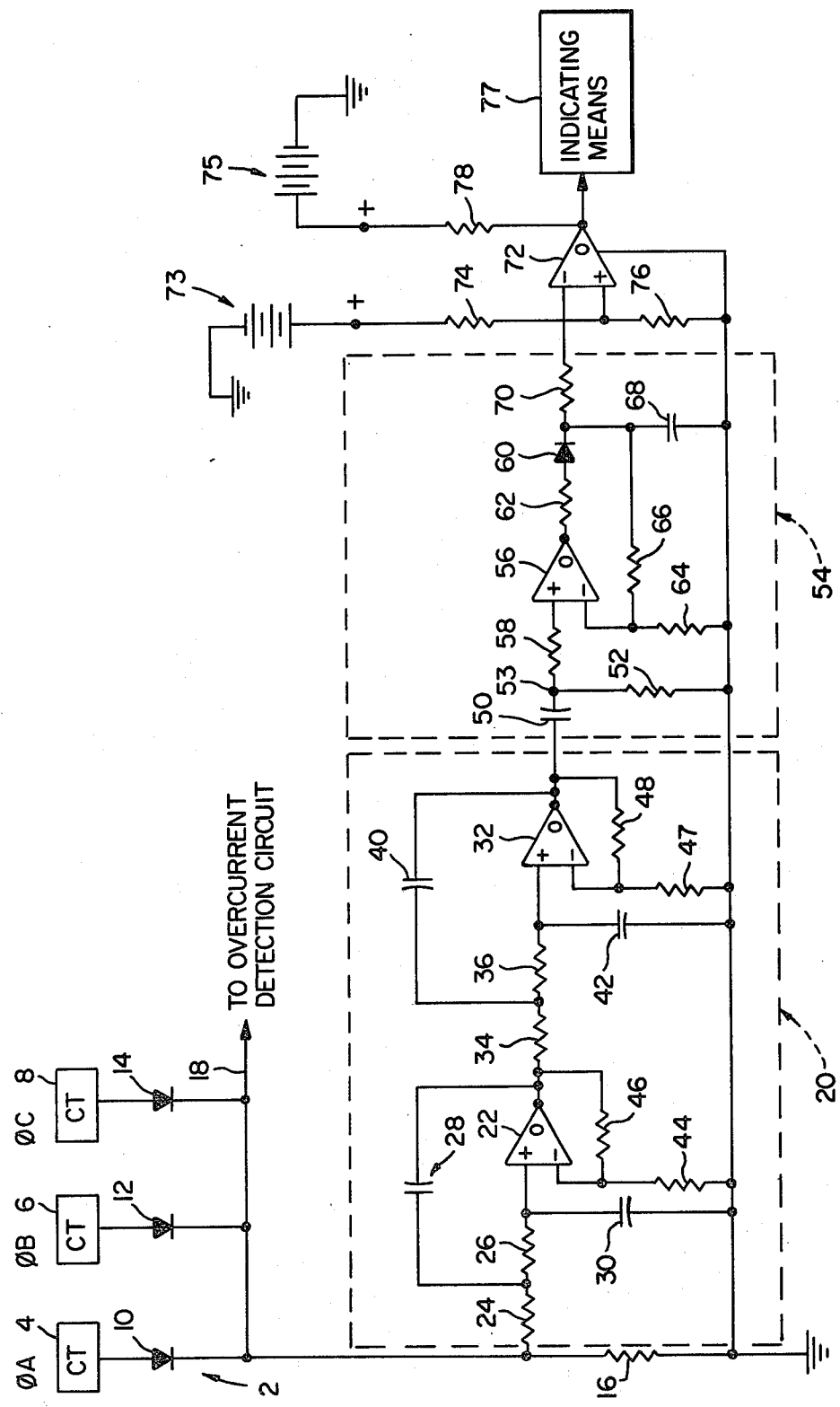

4,423,374

UNBALANCED CURRENT DETECTOR FOR THREE PHASE ELECTRICAL SYSTEM

BACKGROUND OF THE INVENTION

Three phase, three wire or four wire electrical systems require detectors for detecting unbalanced phase currents. It is preferable that the detectors use equipment already available in such systems. The only available equipment suitable for this purpose includes an arrangement of three current transformers, one for each phase current, used to detect overcurrent conditions in the system.

As will be understood by those skilled in the art, in order to detect overcurrent conditions the outputs of the current transformers are full-wave rectified and applied through a burden resistor. Because of the rectification, the voltage wave-form across the burden resistor is non-sinusoidal and, as a result, conventional means for detecting unbalanced currents, such as negative sequence currents requiring phase shifting networks, cannot be used.

The present invention makes use of the harmonic content of a rectified ripple voltage developed across the burden resistor to detect unbalanced current conditions. In this connection, it is noted that the current transformers are essentially current sources. The burden resistor accomplishes a current vector addition which provides a ripple voltage across the resistor at a predetermined frequency (2400 Hz, for example) when the nominal (400 Hz, for example) phase currents are balanced. An unbalanced, ungrounded system load provides a component at a predetermined frequency (800 Hz, for example) which is proportional to the degree of unbalance. An unbalanced load whose neutral is grounded provides a component at another predetermined frequency (400 Hz, for example) which is proportional to the degree of unbalance. An appropriate filter (low-pass) can be used to pass the 400/800 Hz components while rejecting the 2400 Hz component, and hence a dependable indication of current unbalance is provided.

SUMMARY OF THE INVENTION

This invention contemplates apparatus for detecting an unbalanced current condition in three phase electrical systems of the type including a current transformer for each phase, means for rectifying the outputs of the current transformers and a burden resistor which performs a current vector addition.

A ripple voltage having a particular harmonic content is developed across the burden resistor. This voltage is applied to a filter which is selected to pass the highest value of a selected harmonic of the system nominal frequency without significant attenuation. The output of the filter is applied to a resistance-capacitance circuit which removes the DC component of the ripple voltage and the remaining AC components are amplified and rectified. The amplified and rectified voltage is applied to a comparator which detects when the nominal system harmonics exceed a predetermined threshold in accordance with the three phase current unbalance. The output of the comparator is used to indicate that the unbalanced current threshold has been exceeded.

BRIEF DESCRIPTION OF THE DRAWING

The single FIGURE in the drawing is an electrical schematic diagram showing a three phase electrical system including means according to the invention for detecting current unbalance.

DETAILED DESCRIPTION OF THE INVENTION

A current transformer/rectifier/burden resistor circuit of the type included in three phase electrical systems is designated generally by the numeral 2. Circuit 2 includes a current transformer (CT) 4 for phase A ($\phi$A) of the system; a current transformer 6 for phase B ($\phi$B) of the system; and a current transformer 8 for phase C ($\phi$C) of the system. Current transformers 4, 6, and 8 are connected to diodes 10, 12 and 14, respectively, which rectify the outputs of the current transformers. The outputs of the diodes are applied to a burden resistor 16, which performs a current vector addition, and the output across resistor 16 at output conductor 18 is applied to an overcurrent detection circuit, which is not part of the present invention and hence is not otherwise shown. The control transmitter/rectifier/burden resistor circuit has been simplified to show only the positive burden resistor, as will be understood by those skilled in the art.

For purposes of describing the invention, the phase currents will be considered to have a nominal frequency of 400 Hz. The current vector addition performed by resistor 16, due to the rectification of the current transformer outputs, produces a 2400 Hz ripple voltage across the resistor when the nominal 400 Hz phase currents are balanced. An unbalanced, ungrounded load produces an 800 Hz component which is proportional to the degree of unbalance. An unbalanced load having a grounded neutral produces a 400 Hz component, which is proportional to the degree of unbalance.

With the aforegoing in mind, the voltage across resistor 16 is applied as an input to, for example, a fourth order low-pass filter having a cut-off frequency selected to pass the highest value (800 Hz) of the second harmonic of the system nominal frequency without significant attenuation. This filter is designated generally by the numeral 20 in the drawing.

Filter 20 includes an operational amplifier 22 connected as a voltage controlled, voltage source, second order low-pass filter, with frequency determining elements including a resistor 24 connected intermediate diodes 10, 12, 14 and resistor 16; a resistor 26 serially connected to resistor 24; a capacitor 28 connected intermediate resistors 24 and 26 and connected to an output terminal (O) of amplifier 22, and a capacitor 30 connected intermediate resistor 26 and a noninverting input terminal (+) of amplifier 22 and connected to ground.

The output terminal (O) of amplifier 22 is connected to a noninverting input terminal (+) of an amplifier 32 through serially connected frequency determining resistors 34 and 36. Other frequency determining elements associated with amplifier 32 include a capacitor 40 connected intermediate resistors 34 and 36 and connected to an output terminal (O) of amplifier 32; and a capacitor 42 connected intermediate resistor 36 and the noninverting input terminal (+) of amplifier 32, and connected to ground.

A resistor 44 is connected to the inverting input terminal (−) of amplifier 22 and is connected to ground. A resistor 46 is connected intermediate resistor 44 and inverting input terminal (−) of amplifier 22, and is connected intermediate output terminal (O) of amplifier 22 and resistor 34.

A resistor 47 is connected to an inverting input terminal (−) of amplifier 32 and is connected to ground, and a resistor 48 is connected intermediate resistor 47 and the inverting input terminal (−) of amplifier 32 and is connected to output terminal (O) of amplifier 32.

The output of amplifier 32 at output terminal O, which is the output of low-pass filter 20, is applied through a capacitor 50 and a resistor 52 connected to capacitor 50 and connected to ground. Capacitor 50 and resistor 52 act as a filter and cooperate to remove the DC component of the ripple voltage developed across resistor 16. The remaining AC components of the ripple voltage are applied to a combination precision rectifier/gain stage/peak holding amplifier circuit designated generally by the numeral 54.

Circuit 54 includes an operational amplifier 56 having a noninverting input terminal (+) connected through a resistor 58 to capacitor 50 and to resistor 52 at a circuit point 53. Amplifier 56 amplifies the filtered ripple voltage developed across resistor 16 and the amplified voltage is rectified by a diode 60 connected to an output terminal (O) of amplifier 56 through a resistor 62.

The gain of circuit 54 is determined by a resistor 64 connected to an inverting input terminal (−) of amplifier 56 and connected to ground, and by a resistor 66 connected intermediate resistor 64 and the inverting input terminal (−) of amplifier 56 and connected intermediate the output of diode 60 and a capacitor 68 connected to the output of diode 60 and connected to ground.

It will be seen that diode 60 is connected within the feedback loop of amplifier 56 to remove the diode as a temperature variable element so that its forward drop will not be reflected in the output voltage. Capacitor 68 is effective for holding the peak value of the rectified zero-to-positive peak filter output voltage for an interval determined by the value of capacitor 68 and resistors 64 and 66.

A peak DC voltage is provided across capacitor 68, which is connected through a resistor 70 to an inverting input terminal (−) of a voltage comparator amplifier 72. A noninverting input terminal (+) of amplifier 72 is set at a fraction of a positive reference voltage such as provided by a battery 73, applied through resistors 74 and 76 which act as a voltage divider. The output of amplifier 72 at an output terminal (O) is applied to indicating means 77.

When the nominal 400 Hz or 800 Hz harmonics exceed a predetermined threshold, as determined by the amount of current unbalance in the three phase AC currents, the peak voltage across capacitor 68 will increase to a point where it exceeds the reference voltage at the noninverting input terminal (+) of amplifier 72. This will cause the output of the amplifier to switch from a "high" (open circuit) to a "low" (pulled down to ground) through a resistor 78 connected to a positive source of DC voltage such as a battery 80, with the output of amplifier 72 thereupon being indicative that the current unbalance threshold has been exceeded. This output is applied to indicating means 77, which may be an alarm or trip device for indicating the excessive current unbalance condition.

It is to be noted that the filter configuration including amplifiers 22 and 32 can be modified as gain and stability requirements dictate. It will further be noted that the type of low-pass filter may also be varied. For example, in a less critical application a second order filter may be adequate with a corresponding reduction in circuit components permitted.

Although the invention has been described with reference to a nominal 400 Hz system, it is to be understood that since the concept of the invention is dependent upon the harmonics of the fundamental system frequency, the detector can be used for any frequency AC system, with the low-pass filter cut-off frequency adjusted accordingly.

What is claimed is:

1. For use with a three phase electrical system of the type including a current transformer for each of the three phases, means for rectifying the outputs of the current transformers and a resistor connected to the rectifying means for performing a current vector addition, with a ripple voltage having a particular harmonic content developed across the resistor, apparatus for detecting an unbalanced phase current condition comprising:

means responsive to the ripple voltage for passing the highest value of a selected harmonic of the system nominal frequency without significant attenuation; and means connected to the filter means for detecting when the nominal system harmonics exceed a predetermined threshold commensurate with the unbalanced phase current condition.

2. Apparatus as described by claim 1, including:

circuit means connected to the means responsive to the ripple voltage for filtering the output therefrom to remove the DC component of the ripple voltage developed across the burden resistor.

3. Apparatus as described by claim 2, including:

other circuit means connected to the output of the first mentioned circuit means for adjusting the gain of the output therefrom and for rectifying the gain adjusted output.

4. Apparatus as described by claim 1, including:

indicating means connected to detecting means and responsive to the output therefrom for indicating when the predetermined threshold commensurate with the unbalanced phase current condition has been exceeded.

5. A three phase electrical system comprising:

a current transformer for each of the three phase;

rectifying means for each of the current transformers, each of which is connected to a corresponding current transformer for rectifying the output therefrom;

resistor means connected to each of the rectifying means for performing a current vector addition, with a voltage having a particular harmonic content being developed across the resistor means;

means connected to the resistor means and responsive to the voltage developed thereacross for passing the highest value of a selected harmonic of the system nominal frequency without significant attentuation;

circuit means connected to the filter means for removing the DC component of the voltage developed across the resistor means;

other circuit means connected to the first mentioned circuit means for amplifying and rectifying the remaining AC components of the voltage developed across the resistor means; and means connected to the other circuit means for detecting when the nominal system harmonics exceed a predetermined threshold which is indicative of a three phase current unbalance.

6. Apparatus as described by claim 1, wherein:
each of the phase currents has the same nominal frequency;
the ripple voltage developed across the resistor has a predetermined frequency other than the nominal frequency when the phase currents are balanced; and
an unbalanced phase current condition produces voltage components at frequencies other than the predetermined frequency and commensurate with the degree of unbalance.

7. Apparatus as described by claim 6, wherein:
the means responsive to the ripple voltage for passing the highest value of a selected harmonic of the system nominal frequency without significant attenuation passes the voltage components at frequencies other than the predetermined frequency while blocking the voltage at the predetermined frequency.

8. Apparatus as described by claim 1, wherein:
the means responsive to the ripple voltage for passing the highest value of a selected harmonic of the system nominal frequency without significant attenuation includes a low-pass filter.

9. Apparatus as described by claim 1, wherein:
the means connected to the filter means for detecting when the nominal system harmonics exceed a predetermined threshold commensurate with the unbalance phase current condition includes a comparator circuit.

* * * * *